(12) United States Patent
Huber et al.

(10) Patent No.: US 7,318,077 B2
(45) Date of Patent: Jan. 8, 2008

(54) METHOD FOR TWO-DIMENSIONAL REPRESENTATION, INTERPOLATION AND COMPRESSION OF DATA

(75) Inventors: Klaus Huber, Darmstadt (DE); Heiko Knospe, Cologne (DE)

(73) Assignee: Deutsche Telekom AG, Bonn (DE)

( * ) Notice: Subject to any disclaimer, the term of this patent is extended or adjusted under 35 U.S.C. 154(b) by 738 days.

(21) Appl. No.: 10/686,394

(22) Filed: Oct. 14, 2003

(65) Prior Publication Data
US 2004/0172432 A1  Sep. 2, 2004

(30) Foreign Application Priority Data
Oct. 14, 2002  (DE)  ............... 102 48 543

(51) Int. Cl.
*G06F 17/17* (2006.01)
(52) U.S. Cl. ...................... 708/203; 708/313
(58) Field of Classification Search .............. 708/313, 708/203
See application file for complete search history.

(56) References Cited

U.S. PATENT DOCUMENTS 5,598,453 A * 1/1997 Baba et al. ............. 378/146

5,717,787 A  2/1998 Feo et al.
2002/0140713 A1* 10/2002 Klompenhouwer et al. . 345/690
2004/0098432 A1* 5/2004 Villa et al. ................. 708/400

OTHER PUBLICATIONS

E.T. Whittaker et al., "A course of modern analysis", Cambridge University Press, pp. 524, Cambridge, 1969.
Claude E. Shannon, "Communication in the presence of noise", Proceedings Institute of Radio Engineers, vol. 36, pp. 10-21 (1948). (As reprinted in "Bibliography of Claude Elwood Shannon").
Carl Friedrich Gauss, "Mathematisches tagebuch 1796-1814", Verlag Harri Deutsch, pp. , Thun, Frankfurt, 1985. (See specification).
Adolf Hurwitz, "Vorlesungen über allgemeine funktionentheorie und elliptische funktionen", Springer Verlag, pp. 40-65, 104-13, Berlin, 2000. (See specification).

* cited by examiner

*Primary Examiner*—D. H. Malzahn
(74) *Attorney, Agent, or Firm*—Darby & Darby

(57) ABSTRACT

A method for representation, interpolation and/or compression of data includes identifying a two-dimensional interpolation function s(z) based on a sampling function a(z). A Cauchy integral theorem is applicable for the interpolation function s(z). The interpolation function s(z) is used for the representation, interpolation and/or compression of the data.

20 Claims, 2 Drawing Sheets

METHOD FOR TWO-DIMENSIONAL REPRESENTATION, INTERPOLATION AND COMPRESSION OF DATA

CROSS-REFERENCE TO RELATED APPLICATIONS

Priority is claimed to German Patent Application No. DE 102 48 542.7, filed Oct. 14, 2002, which is hereby incorporated by reference as if set forth in its entirety.

BACKGROUND

The present invention relates to a method for multi-dimensional representation, interpolation and compression of data. More specifically, it relates to the use of two-dimensional sampling functions that are defined over the complex numbers to efficiently represent, interpolate, smooth, or compress data.

In the field of data processing, it is often required to compress data in order to speed up transmission or to improve processing. Therefore, there is a number of compression algorithms that use interpolation methods. Here, mention should be made of known compression methods for images, such as JPEG.

SUMMARY OF THE INVENTION

An object of the present invention is to provide a method which allows efficient compression of information, using interpolation algorithms that meet special requirements.

The invention provides a method for representation and/or interpolation and/or compression of automatically processable data. The method includes using a two-dimensional interpolation formula s(z) based on a sampling function a(z). The Cauchy integral theorem and, possibly, the residue theorem are applicable for the interpolation formula.

The methods used here have the special feature that holomorphic or meromorphic functions are used. A detailed description of these technical terms can be gathered, for example, from A. Hurwitz, Vorlesungen über allgemeine Funktionentheorie und Elliptische Funktionen [Lectures on General Theory of Functions and Elliptic Functions], fifth edition, Springer, Berlin Heidelberg New York, 2000, which is hereby incorporated by reference herein. If a function in an open subset is differentiable with respect to a complex variable, then the function on this subset is referred to as "holomorphic". A function is meromorphic if a function has at most a finite number of poles in a limited region in the complex numbers and if, outside of these poles, the function is holomorphic in the complex numbers.

Applicable to such functions are theorems from the theory of functions which can be used for two-dimensional signal processing and signal compression. This holds especially true for a two-dimensional sampling function that is based on the Sinus Lemniscatus (see Gauss, Mathematisches Tagebuch [Mathematical Diary] 1796-1814, Harri Deutsch, 1985, which is hereby incorporated by reference herein). The behavior of such a two-dimensional sampling function is exceptionally suitable for sampling and interpolation purposes.

The method is suitable for interpolation, smoothing and compression of data. The special feature is the applicability of function-theoretical methods, which is made possible by satisfaction of the Cauchy-Riemann conditions. Also suitable is a Sinus Lemniscatus based interpolation formula which is based on the function sl(z)/z, as described later, and which yields identical interpolation functions in the two dimensions (x and y axes).

Using the Cauchy integral theorem and the residue theorem, the new representation can be used for compressing data.

BRIEF DESCRIPTION OF THE DRAWINGS

The invention is elaborated upon below based on exemplary embodiments with reference to the drawings, in which.

DETAILED DESCRIPTION

Figure 1:
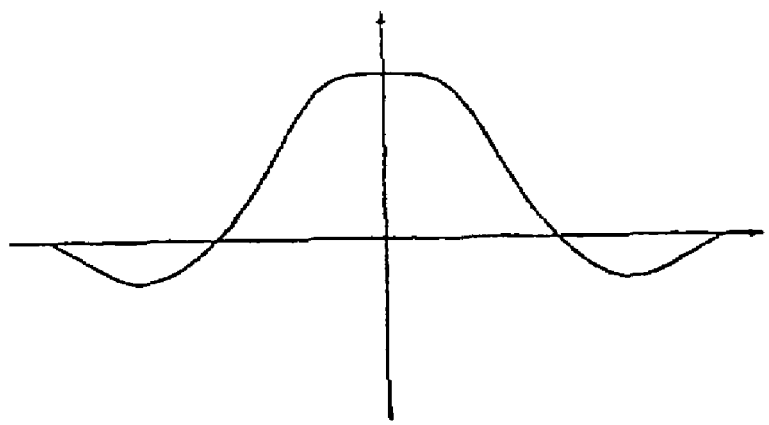
FIG. 1 shows a two-dimensional sampling function $a(z) = sl(\pi z)/(\pi z)$

A point P=(x, y), which is given by the real values x and y in Cartesian coordinates, is represented as a complex number $z=x+i*y$, with i being the square root of −1.

The case under discussion is that of equidistant sampling; that is, the values $z_j$, for which sampled values exists, lie on the intersection points of a grid. For the sake of simplicity, normalization to unit distance is done, and a subset of the so-called "Gaussian integers" is taken as the set of sampling points. The Gaussian integers are complex numbers whose real and imaginary parts are integers. The values of two-dimensional functions s(z) at sampled values $z_j$ are given by $s_j$. Values $s_j$ mostly belong to the complex numbers or to the real numbers, or to finite approximations of these numbers, such as are used for information processing in technical equipment.

An essential feature of the functions s(z) discussed in the present invention is that they satisfy the Cauchy-Riemann differential equations, except at possibly existing pole positions; that is, they are holomorphic or meromorphic.

Satisfaction of these equations is the fundamental condition for the applicability of the so-called Cauchy integral theorem or of the residue theorem. According to this theorem, the values of s(z) within a closed curve C can be calculated using the values of the function s(z) that are located on the boundary of the area bounded by C. This opens a number of new possibilities for the representation, interpolation and compression of data.

Suitable functions for use as a function s(z) are especially those having zeros at least over the set of sampling points $z_j$, except at point z=0. These functions include, for example, suitably selected polynomials.

The following is a summary of the advantageous properties of a(z):
1. It holds that a(z)=1 or another suitable constant.
2. It holds that $a(z_j)=0$, with $z_j \neq 0$ being a Gaussian integer.
3. The function is holomorphic, except at possibly occurring pole positions.

The function s(z) is now expressed as:

$$s(z) = \Sigma s_j \cdot a(z - z_j).$$

Suitable for a(z) are numerous functions having zeros at least at the sampling points. Moreover, in order to obtain functions that behave in a suitable manner during interpolation and approximation, it is convenient if the subset of the Gaussian integers that are zeros of the function a(z) extend beyond sampled values $z_j$ at least to curve C.

A function formed by the Sinus Lemniscatus is especially suitable for practical applications. The Sinus Lemniscatus is a function introduced by Gauss (see Gauss, Mathematisches Tagebuch [Mathematical Diary] 1796-1814, Harri Deutsch, 1985) which is similar to the known sine function and which can be represented using the well-known Jacobian elliptic functions. It holds, for example, that $sl(z)=(1/\sqrt{2})\cdot sd(\sqrt{2}z,1/\sqrt{2})$, where sd can be expressed, for example, using the standard functions sn and dn as follows: $sd(z,k)=sn(z,k)/dn(z,k)$ (see, for example, E. T. Whittaker, G. N. Watson, A course of modern analysis, fourth edition, Cambridge, reprinted 1969, page 524, which is hereby incorporated by reference herein).

Using the Sinus Lemniscatus, in short sl(z), extending the well-known one-dimensional sampling function $\sin(\pi x)/(\pi x)$ (see, for example, C. Shannon, Communication in the presence of noise, Proceedings Institute of Radio Engineers, Vol. 36, 1948, pp.10-21, which is hereby incorporated by reference herein), it is possible to form a two-dimensional function $$a(z) = \frac{sl(\bar{\pi}z)}{\bar{\pi}z}.$$

The role of $\pi$ in the one-dimensional sampling function is assumed by the value $$\bar{\pi} \approx 2.622057554.$$

In FIG. 1, the function a(z) is shown for real z=x in the range $-2<x<2$.

A remarkable feature of function a(z) is that it holds that $a(iz)=a(z)$; that is, that the function is 90 degree rotationally invariant in the complex plane. In particular, the function yields the same values for purely imaginary values as for real values, and therefore has the property that the sampling function is identical in both dimensions, which is very convenient for two-dimensional interpolation. This is a property which is not found in the classical sampling function because in the case of purely imaginary arguments, the classical sine function can be represented by the exponential function sin h.

The very good behavior of sl(z)/z is particularly advantageous for sampling and interpolation. This is also shown by the so-called "Fourier transform".

As can be seen from the Fourier transform, the function is very close to the low-pass behavior of the sin(x)/x in terms of the frequency components.

Figure 2:
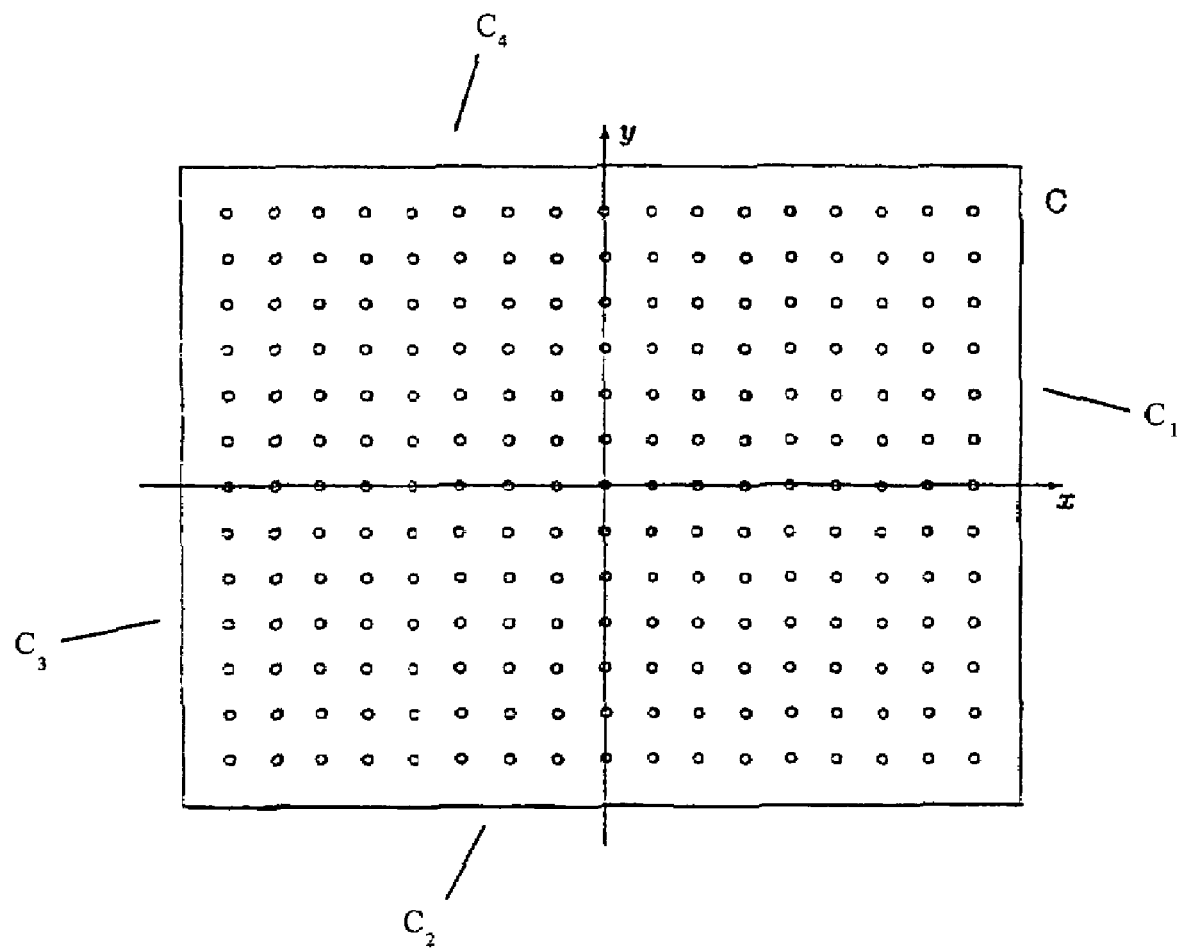
FIG. 2 shows a closed curve C with sampling points within C.

According to the well-known Cauchy integral theorem, holomorphic functions within a closed curve can be determined by the values on this curve. A corresponding typical scenario is depicted in FIG. 2.

Sampling points $z_j$ are represented by small circles. Knowing the function s(z) at sampling points $z_j$, that is, $s(z_j)=sj$, it is possible to calculate function s(z) according to $s(z)=\Sigma s_j \cdot a(z-z_j)$ also at the points of curve C. The points on the curve are referred to by variable $\tau$.

If sampling function a(z) has no poles within C, then, according to the Cauchy integral theorem, it is true for values z within C that:

$$s(z) = \frac{1}{2\pi i}\oint_c \frac{s(\tau)d\tau}{\tau - z}$$

the curve being passed through in mathematically positive direction.

If function a(z) has poles, then it is possible to extend the formula $$s(z) = \frac{1}{2\pi i}\oint_c \frac{s(\tau)d\tau}{\tau - z}$$

by including the corresponding residues using the well-known residue theorem.

In this context, it is essential that the points within C can be determined by the points $\tau$ on curve C. Thus, we have a universal method for storing two-dimensional data, but also general data known as values $s_j$, using values on curve C.

In the case of meromorphic functions, possibly, residues have to be included as well. In this context, the path length, for example, can be used for parameterization.

Depending on the redundancy of data $s_j$, it is possible to make do with less data on the curve. This results in the compression effect.

EXAMPLE

The present invention will now be described by way of an example.

Discussed are the points of FIG. 2; the values of function $s(z)=si(\pi x/5)\cdot si(\pi y/5)$ being taken as the sampled values $s_j(z_j)$, where $z=x+iy$ and $si(x)=\sin(x)/x$. The complex sampling points $z_j$ are the $17\cdot 13=221$ Gaussian integers within curve C.

Curve C is composed of four straight-line pieces $C_1$, $C_2$, $C_3$ and $C_4$.

Figure 3:
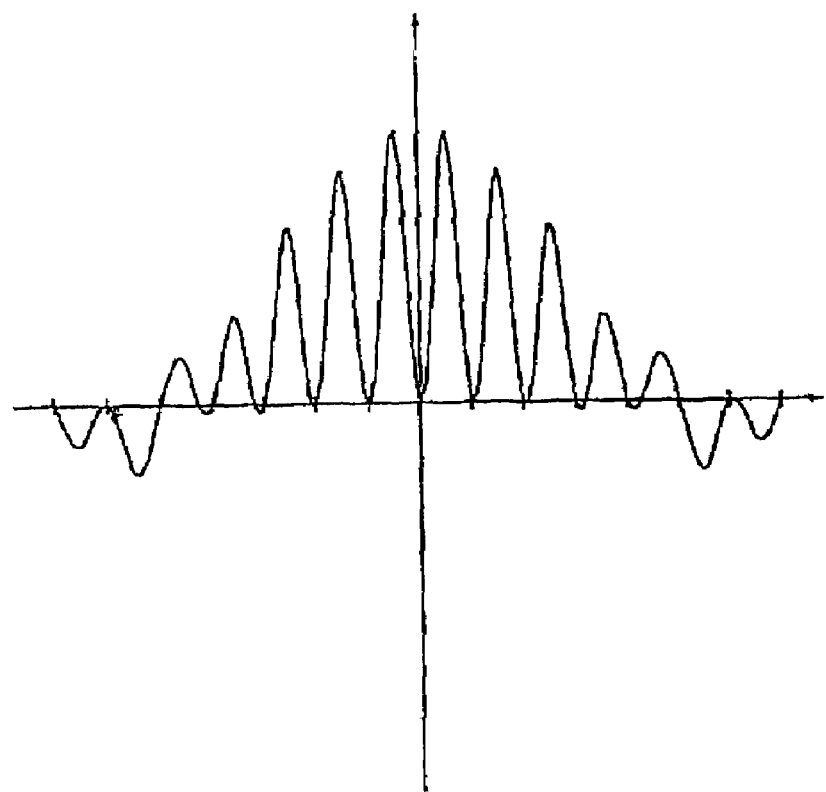
FIG. 3 shows the real part of s(z) on $C_1$.
Figure 4:
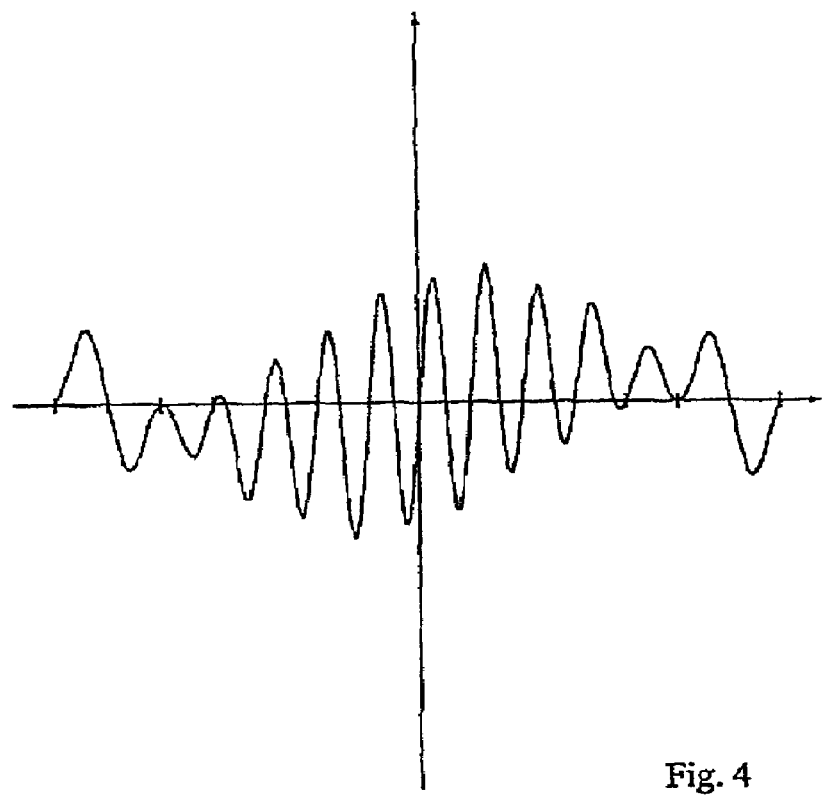
FIG. 4 shows the imaginary part of s(z) on $C_1$.

The segment $C_1$ has the real part 9, and the imaginary part runs from $-7$ to 7. The real part of s(z) on curve $C_1$ is shown in FIG. 3, and the imaginary part of s(z) is depicted in FIG. 4. The graphs for the remaining curve segments $C_{2,3,4}$ are similar.

As can be seen from the drawings, the calculation of the contour integrals is essentially a low-pass filtering.

What is claimed is:

1. A method for compression of data, the method comprising the steps of:
    identifying a two-dimensional interpolation function s(z) based on a sampling function a(z), wherein a Cauchy integral theorem is applicable for the interpolation function s(z); and
    compressing the data using the interpolation function s(z).

2. The method as recited in claim 1, wherein a residue theorem is applicable for the interpolation function s(z).

3. The method as recited in claim 2 wherein the step of compressing the data the using the interpolation function comprises the steps of:
    mapping the data onto points within a curve C; and
    representing the data by points on a closed boundary curve, the representing being performed using the interpolation function s(z).

4. The method as recited in claim 1 wherein the sampling function s(z) is a function over the complex numbers for which a(0)=1 and at least all other sampled values $z_j$ to be considered is equal to zero.

5. The method as recited in claim 4 wherein the interpolation function s(z) can be represented by $$s(z)=\Sigma s_j \cdot a(z-z_j)$$

wherein s(z) is capable of being represented by the function values $s_j$ at the complex sampling points $z_j$.

6. The method as recited in claim 4, further comprising the step of:
calculating values of the two-dimensional interpolation function s(z) within a closed curve C using values of the two-dimensional interpolation function s(z) located on a boundary of an area bounded by C so as to perform a low-pass filtering of the data.

7. The method as recited in claim 1 wherein the sampling function a(z) is constructed using at least one of a double-periodic and a quasi-double periodic complex function.

8. The method as recited in claim 1 wherein the sampling function a(z) is a complex holomorphic function.

9. The method as recited in claim 8 wherein the sampling function a(z) is a complex holomorphic function except at existing poles.

10. The method as recited in claim 1 wherein sampled values of the interpolation function s(z) are located within a closed curve C.

11. The method as recited in claim 1 wherein function values of the interpolation function s(z) for points on a curve C are determined by an equation $s(z)=\Sigma s_j \cdot a(z-z_j)$.

12. The method as recited in claim 11 wherein the curve C is a closed curve and wherein function values on the curve C are parameterized using a path length so as to obtain an equivalent one-dimensional data set.

13. The method as recited in claim 12 wherein points of interpolation function s(z) within the curve C are determined by function values on the curve C using the Cauchy integral theorem and, if poles are present, using the residue theorem.

14. The method as recited in claim 1 wherein the sampling function a(z) satisfies $a(z)=sl(\overline{\pi}z)/(\overline{\pi}z)$.

15. The method as recited in claim 14 wherein sl(z) is a Sinus Lemniscatus, the Sinus Lemniscatus being an elliptic function which can be represented using Jacobian elliptic functions.

16. The method as recited in claim 1 wherein the step of compressing the data using the interpolation function comprises the steps of:
mapping the data onto points within a curve C; and
representing the data by points on a closed boundary curve, the representing being performed using the interpolation function s(z).

17. The method as recited in claim 16 wherein the mapping the data onto points within the curve C is performed on a line-by-line basis.

18. The method as recited in claim 1 wherein the data is automatically processable.

19. A computer readable medium having stored thereon computer executable process steps operative to perform a method for compression of data, the method comprising the steps of:
identifying a two-dimensional interpolation function s(z) based on a sampling function a(z), wherein a Cauchy integral theorem is applicable for the interpolation function s(z); and
compressing the data using the interpolation function s(z).

20. A computer system comprising a processor configured to execute computer executable process steps operative to perform a method for compression of data, the method comprising:
identifying a two-dimensional interpolation function s(z) based on a sampling function a(z), wherein a Cauchy integral theorem is applicable for the interpolation function s(z); and
compressing the data using the interpolation function s(z).

* * * * *